(12) United States Patent
Mashimo et al.

(10) Patent No.: US 8,653,433 B2
(45) Date of Patent: Feb. 18, 2014

(54) TRANSIMPEDANCE AMPLIFIER AND PON SYSTEM

(75) Inventors: Daisuke Mashimo, Kawasaki (JP); Hiroki Ikeda, Hachioji (JP); Yoshinobu Morita, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 436 days.

(21) Appl. No.: 13/145,047

(22) PCT Filed: Jan. 13, 2010

(86) PCT No.: PCT/JP2010/050278
§ 371 (c)(1),
(2), (4) Date: Jul. 18, 2011

(87) PCT Pub. No.: WO2010/082585
PCT Pub. Date: Jul. 22, 2010

(65) Prior Publication Data
US 2011/0291766 A1    Dec. 1, 2011

(30) Foreign Application Priority Data

Jan. 19, 2009  (JP) ................. 2009-008555

(51) Int. Cl.
*H03G 3/20* (2006.01)
(52) U.S. Cl.
USPC ............... 250/214 AG; 250/214.1; 330/254; 330/278
(58) Field of Classification Search
USPC ............ 250/214 AG, 214.1, 214 R, 214 DC, 250/208.1, 208.2; 370/503, 508, 509, 510, 370/511, 512, 513, 514; 375/326, 316, 340, 375/354, 355; 330/254, 278
See application file for complete search history.

(56) References Cited

U.S. PATENT DOCUMENTS

| 6,246,282 B1 | 6/2001 | Oono et al. | |
| 6,760,552 B1 * | 7/2004 | Tajima et al. | 398/210 |

(Continued)

FOREIGN PATENT DOCUMENTS

| JP | 2000-151290 A | 5/2000 |
| JP | 2000-315923 A | 11/2000 |

(Continued)

OTHER PUBLICATIONS

International Search Reporting with partial English translation dated Apr. 13, 2010 (five (5) pages).
Form PCT/ISA/237 (four (4) pages).

*Primary Examiner* — Francis M Legasse, Jr.
(74) *Attorney, Agent, or Firm* — Crowell & Moring LLP (57) ABSTRACT

In a gain-switching-type transimpedance amplifier, in order to provide a technique capable of preventing unnecessary gain switching caused when noise is received, and preventing decrease in sensitivity caused when noise with a large input level is received, and then, a burst signal with a small input level is received, a transimpedance amplifier 5 includes: a pre-amplifier 200 to which the burst signal is inputted; an average detection start determination unit 300 for comparing an output of a pre-amplifier 200 with a first threshold voltage; an average detection circuit 400 for detecting and outputting an average value of the output of the pre-amplifier 200 during a certain period of time from a time point when the output of the pre-amplifier 200 exceeds the first threshold voltage; and a gain switching control unit 500 for determining whether to switch a gain of the pre-amplifier 200 based on an output of the average detection circuit 400.

20 Claims, 10 Drawing Sheets (56) References Cited

U.S. PATENT DOCUMENTS

| | | | |
|---|---|---|---|
| 7,720,394 B2 * | 5/2010 | Nakamoto et al. | 398/208 |
| 8,165,478 B2 * | 4/2012 | Noda et al. | 398/209 |
| 2004/0145419 A1 | 7/2004 | Nogami et al. | |
| 2007/0098416 A1 | 5/2007 | Nogami et al. | |
| 2008/0205906 A1 | 8/2008 | Murata | |
| 2008/0309407 A1 | 12/2008 | Nakamura et al. | |

FOREIGN PATENT DOCUMENTS

| | | |
|---|---|---|
| JP | 2003-243955 A | 8/2003 |
| JP | 2006-311033 A | 11/2006 |
| JP | 2008-211702 A | 9/2008 |
| WO | WO 2007/036993 A1 | 4/2007 |

* cited by examiner

TRANSIMPEDANCE AMPLIFIER AND PON SYSTEM

TECHNICAL FIELD

The present invention relates to a PON (Passive Optical Network) system including an OLT (Optical Line Termination: Subscriber Storage Device) and a plurality of ONUs (Optical Network Units: Optical-line Subscriber Terminal Device), and more particularly, the present invention relates to a technique effectively applied to a technique of gain switching in a transimpedance amplifier in a burst signal receiver.

BACKGROUND ART

The PON system is a high speed/large capacity optical access system in which an optical fiber transmission line and/or the OLT are shared by the plurality of ONUs, and attracts attention as a technique capable of suppressing a cost per user. In this PON system, an optical signal (downlink signal) from the OLT to the ONU is a continuous signal. On the other hand, an optical signal (uplink signal) from the ONU to the OLT is subjected to transmission control in the OLT in order to prevent signal collision to be a burst signal, and besides, a distance between the ONU and the OLT is different from the other depending on a user, and therefore, the OLT receives optical signals having different levels. Therefore, the OLT is required to have a receiver capable of achieving high reception sensitivity and a wide dynamic range.

As a method of achieving the wide dynamic range, a method with using a transimpedance amplifier for switching a gain in accordance with an input level of the burst signal is widely used. Patent Document 1 discloses a transimpedance amplifier which compares an instantaneous value of an output voltage with a threshold voltage and controls a gain switching circuit in accordance with its result. This method shows a configuration in which, by providing hysteresis characteristics to the gain switching determination circuit, a gain switching operation is performed based on a result compared and determined by a first hysteresis characteristic, and then, the gain switching operation is stopped based on a result compared and determined by a second hysteresis characteristic having a lower voltage detection level than that of the first hysteresis characteristic, so that the gain is fixed.

PRIOR ART DOCUMENT

Patent Document

Patent Document 1: Japanese Patent Application Laid-Open Publication No. 2006-311033

DISCLOSURE OF THE INVENTION

Problems to be Solved by the Invention

However, the above-described conventional technique has the following problem. In the PON system, noise is caused by various factors. For example, there are reflection of the downlink signal transmitted by the OLT, leakage light from the other ONU, a reset signal in the OLT, and others. In the conventional technique, when the noise caused by these factors is inputted to a receiver at a level larger than a gain switching threshold value, the gain of the transimpedance amplifier is set small by the operation of the gain switching determination circuit. If the burst signal which is received after this switching operation or is on receiving is a signal whose input level is small and whose gain is not to be actually reduced, the burst signal is not sufficiently amplified, and as a result, the reception sensitivity is adversely decreased.

Therefore, in the gain-switching-type transimpedance amplifier in the burst signal receiver included in the OLT of the PON system, a function of not switching the gain when the noise is received but switching the gain into an appropriate gain for the burst signal is required.

Accordingly, a preferred aim of the present invention is, in the gain-switching-type transimpedance amplifier in the burst signal receiver included in the OLT of the PON system, to provide a technique capable of preventing an unnecessary gain switching caused when the noise is received and preventing the decrease in sensitivity caused when the noise with the large input level is received, and then, the burst signal with the small input level is received.

The above and other preferred aims and novel characteristics of the present invention will be apparent from the description of the present specification and the accompanying drawings.

Means for Solving the Problems

The typical ones of the inventions disclosed in the present application will be briefly described as follows.

That is, as the typical one, a transimpedance amplifier for switching a gain to be small when a burst signal with a large optical input level is inputted includes: a pre-amplifier to which the burst signal is inputted; an average detection start determination unit for comparing an output of the pre-amplifier with a first threshold voltage; an average detection circuit for detecting and outputting an average value of outputs of the pre-amplifier during a certain period of time from a time point when the output of the pre-amplifier exceeds the first threshold voltage; and a gain switching control unit for determining whether to switch the gain of the pre-amplifier based on an output of the average detection circuit. In such a configuration, when the output voltage of the pre-amplifier is compared with the first threshold voltage, and, if the output voltage exceeds the first threshold voltage, the average value of the output voltage during the certain period of time is detected, and besides, if the average value exceeds a second threshold voltage, the gain is reduced, so that the burst signal with the large input level is handled to obtain an appropriate output waveform.

Effects of the Invention

The effects obtained by typical aspects of the present invention will be briefly described below.

That is, in the gain-switching-type transimpedance amplifier, the effect obtained by the typical aspect is to prevent the unnecessary gain switching caused when the noise is received due to the reflection of the downlink signal transmitted by the OLT, the leakage light from other the other ONU, the reset signal in the OLT, and others, and besides, to prevent the decrease in sensitivity caused when the noise with the large input level is received, and then, the burst signal with the small input level is received.

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment and examples, and the repetitive description thereof will be omitted.

[Embodiment of Invention]

Figure 1:
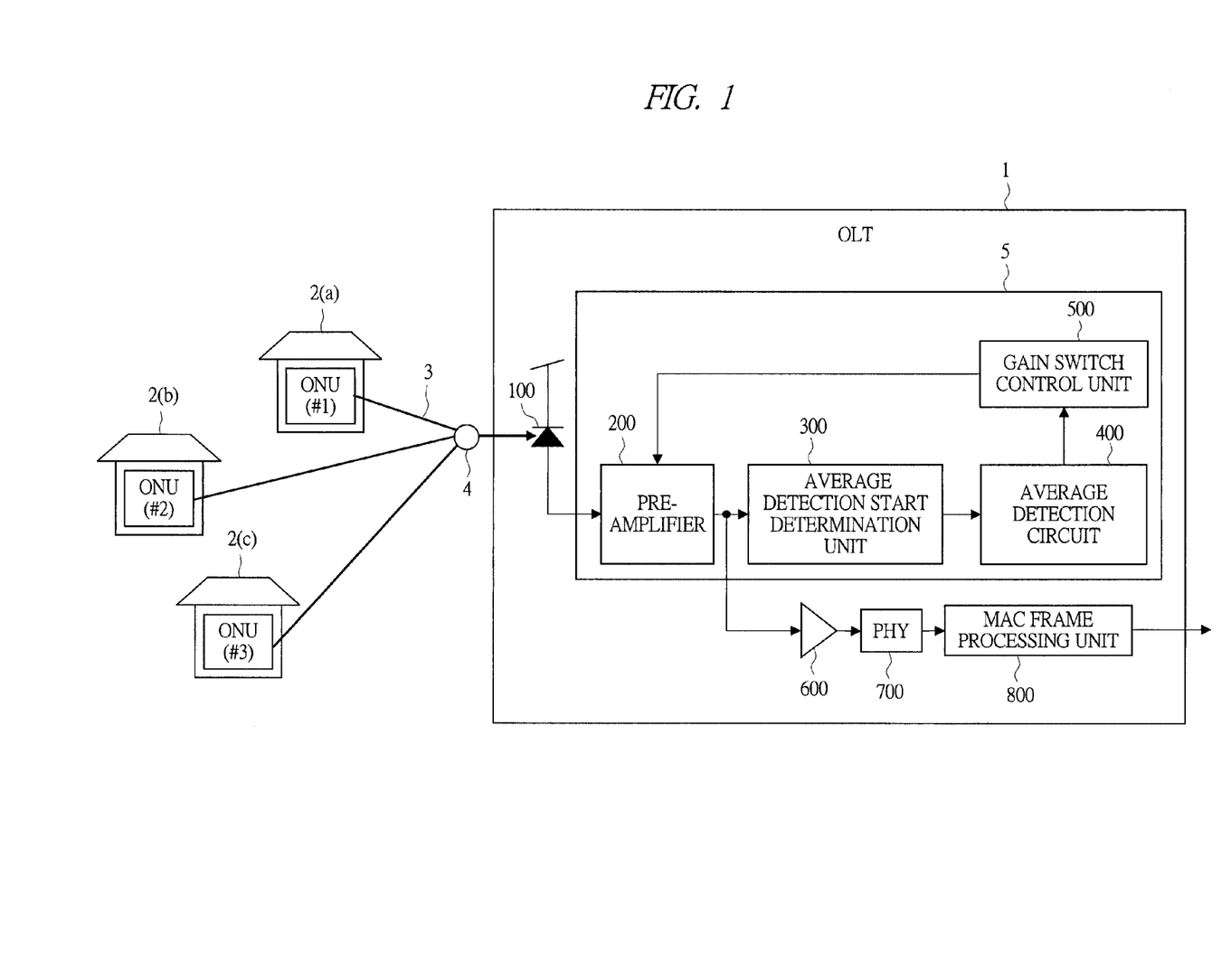
FIG. 1 is a block diagram showing a configuration example of a PON system according to an embodiment to which the present invention is applied.

A block diagram of a configuration example of a PON system of an embodiment to which the present invention is applied is shown in FIG. 1. As shown in FIG. 1, the entire PON system of the present embodiment includes: an OLT 1; a plurality of ONUs 2 (in FIG. 1, three examples: 2(a), 2(b), and 2(c)); optical fibers 3; and an optical divider 4, the optical fibers and the optical divider being provided between the OLT and the ONUs. An internal configuration of the OLT 1 includes a part related to the reception of the uplink optical signal from the ONU 2 and a part of processing a frame.

The part related to the reception of the uplink optical signal includes: a light-receiving element 100 for converting an optical signal into an optical current; a transimpedance amplifier 5 for converting the optical current into a voltage signal; and a post-amplifier 600 for amplifying the voltage signal to certain amplitude. The part of processing the frame includes: a PHY 700 for coding and decoding a PON frame; and a MAC frame processing unit 800 for processing a MAC frame so as to be connected to an external network.

Here, the transimpedance amplifier 5 which is the present invention includes: a pre-amplifier 200 for converting an optical current into a voltage signal; an average detection start determination unit 300 for comparing an output of the pre-amplifier 200 with a first threshold voltage; an average detection circuit 400 for detecting and outputting an average value of outputs of the pre-amplifier 200 during a certain period of time from a time point when an output of the pre-amplifier 200 exceeds the first threshold voltage; and a gain switching control unit 500 for determining whether to switch a gain of the pre-amplifier 200 based on an output of the average detection circuit 400.

Hereinafter, embodiments of the present invention will be described in detail by citing examples.

[First Embodiment]

Figure 2:
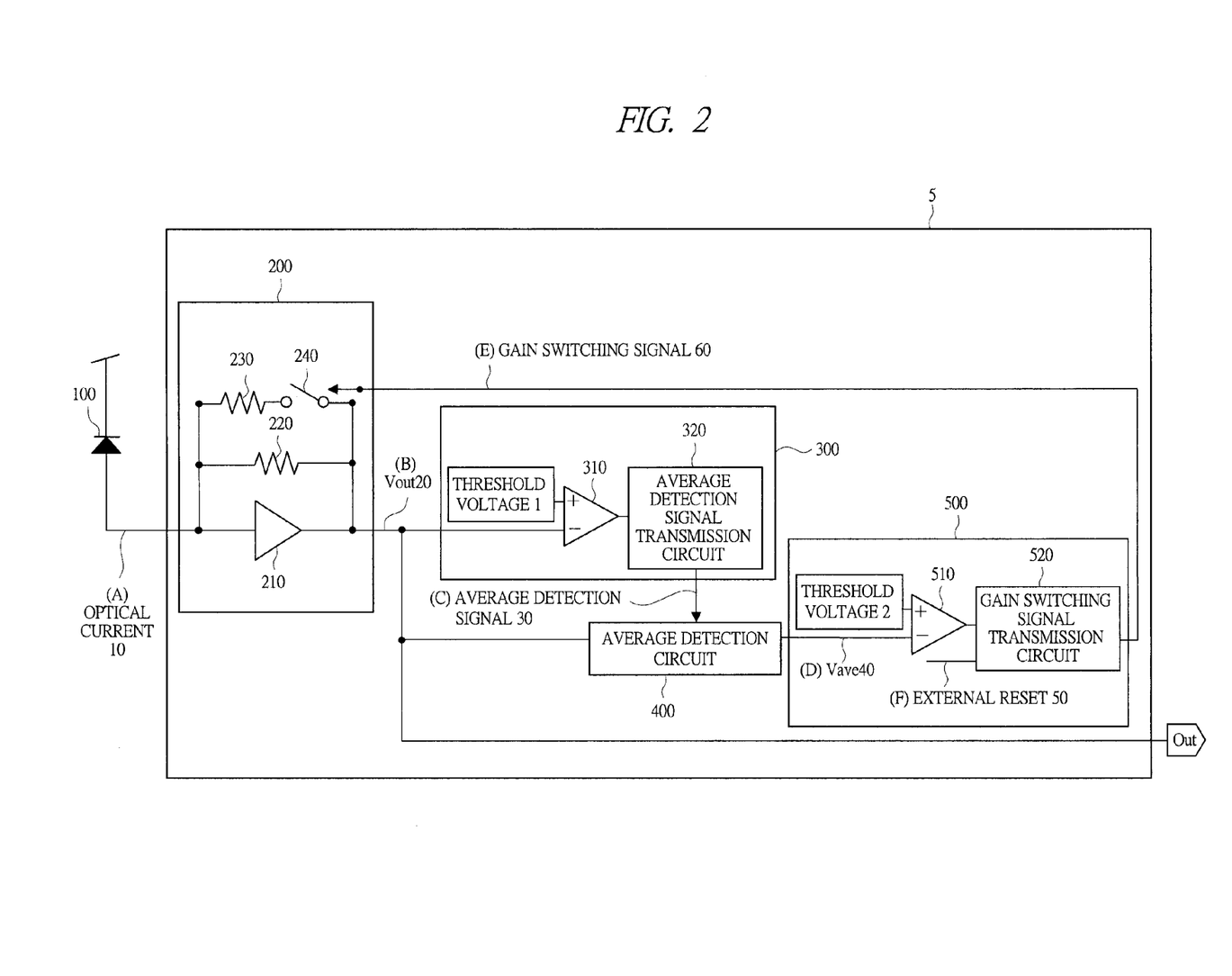
FIG. 2 is a diagram showing a configuration example of a transimpedance amplifier according to a first embodiment of the present invention.

First, a configuration of a transimpedance amplifier according to a first embodiment of the present invention will be described below with reference to FIG. 2. A transimpedance amplifier 5 in the present embodiment includes: a pre-amplifier 200 for converting an optical current 10 transmitted from a light-receiving element 100 into a voltage signal "Vout" 20; an average detection start determination unit 300 for determining a start of an average detection of the output voltage of the pre-amplifier 200 and transmitting an average detection signal 30; an average detection circuit 400 for detecting an average value "Vave" 40 of the output voltage of the pre-amplifier 200 based on the average detection signal 30 from the average detection start determination unit 300; and a gain switching control unit 500 for switching a gain of the pre-amplifier 200 based on the average value Vave 40.

(Explanation on Pre-Amplifier 200)

The pre-amplifier 200 includes: an inverting amplifier 210; a first feedback resistor 220 connected in parallel with the inverting amplifier 210; a second feedback resistor 230 also connected in parallel therewith; and a switch 240 connected in series with the second feedback resistor 230. When the optical current 10 is inputted from the light emitting element 100 to the pre-amplifier 200, the optical current is converted into the voltage signal, and this output voltage signal Vout 20 is outputted.

(Explanation on Feedback Resistors 220 and 230)

The gain of the pre-amplifier 200 is controlled by opening and closing the switch 240. An initial state is such that the first feedback resistor 220 is connected in parallel with the inverting amplifier 210. When the switch 240 is closed, the second feedback resistor 230 is also connected in parallel therewith, and the gain is reduced.

(Explanation on Switch 240)

The switch 240 is opened and closed in accordance with a gain switching signal 60 transmitted from the gain switching control unit 500. The switch 240 may be an element having a switching function such as a MOS transistor, and a relay or others may be used.

(Explanation on Average Detection Start Determination Unit 300)

The average detection start determination unit 300 includes: a comparator 310; and an average detection signal transmission circuit 320.

(Explanation on Comparator 310)

A threshold voltage 1 is inputted to a positive side of the comparator 310, and the output voltage signal Vout 20 from the pre-amplifier 200 is inputted to a negative side thereof. When the Vout 20 exceeds the threshold voltage 1, an output of the comparator 310 becomes at a High level, and is inputted to the average detection signal transmission circuit 320.

(Explanation on Average Detection Signal Transmission Circuit 320)

The average detection signal transmission circuit 320 is a circuit which continuously transmits the average detection signal 30 to the average detection circuit 400 during a predetermined period of time T when the High level signal is inputted from the comparator 310, and can be achieved by, for example, a circuit with a SR-FF (Set Reset-Flip Flop) or others.

(Explanation on Average Detection Circuit 400)

When the average detection circuit 400 receives the average detection signal 30 outputted from the average detection start determination unit 300, this detects the average value Vave 40 of the voltage signal Vout 20 during the period of time T from a time point of the receiving, and outputs the value to the gain switching control unit 500 during a certain period of time. A configuration example of the average detection circuit 400 will be explained later.

(Explanation on Gain Switching Control Unit 500)

The gain switching control unit 500 includes: a comparator 510; and a gain switching signal transmission circuit 520.

(Explanation on Comparator 510)

A threshold voltage 2 is inputted to a positive side of the comparator 510, and the average value Vave 40 outputted from the average detection circuit 400 is inputted to a negative side thereof. When the Vave 40 exceeds the threshold voltage 2, an output of the comparator 510 becomes at a High level, and is inputted to the gain switching signal transmission circuit 520.

(Explanation on Gain Switching Signal Transmission Circuit 520)

When the High level signal is inputted from the comparator 510 to the gain switching signal transmission circuit 520, the gain switching signal transmission circuit 520 transmits a gain switching signal 60, so that the switch 240 included in the pre-amplifier 200 is closed to reduce the gain of the pre-amplifier 200. And therefore, even when the burst signal with the large input level is inputted, an appropriate output waveform can be obtained. Also, by using the average value of the output of the pre-amplifier 200 for determining the gain switching by the average detection circuit 400, the unnecessary gain switching caused by the noise can be prevented.

(Explanation on Operation of First Embodiment)

Figure 3:
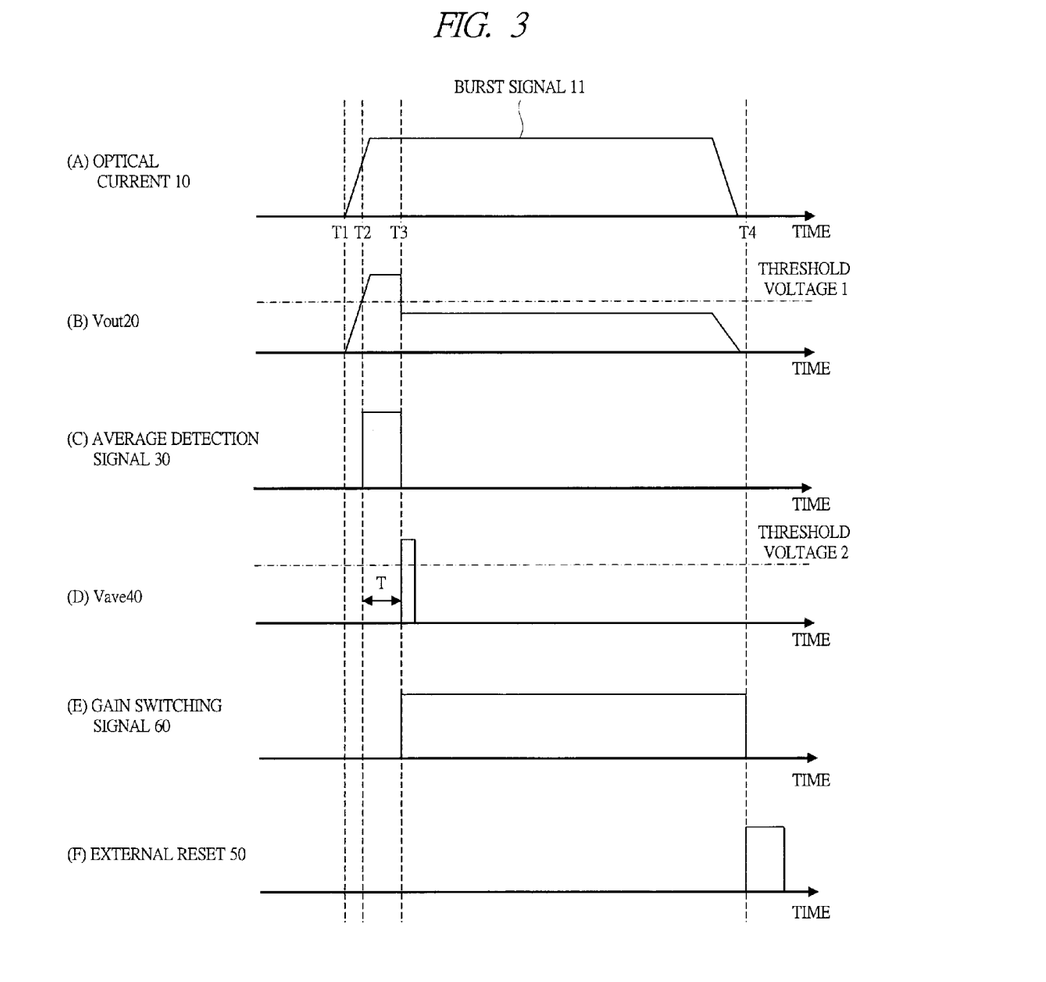
FIG. 3 is a diagram showing an operation timing example of the transimpedance amplifier according to the first embodiment of the present invention.
Figure 4:
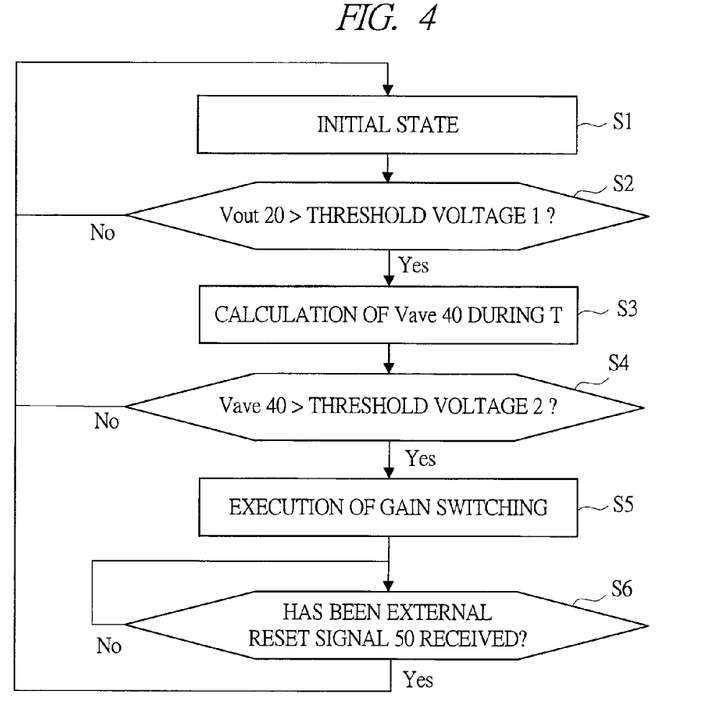
FIG. 4 is a flowchart showing an operation example of the transimpedance amplifier according to the first embodiment of the present invention.

Here, an operation example of the first embodiment will be described as following an operation timing example shown in FIG. 3. Symbols (A) to (F) in FIG. 3 correspond to the signals with the same symbols in FIG. 2, respectively. Also, a flowchart of the present operation example is shown in FIG. 4.

In the transimpedance amplifier 5 according to the present embodiment, the switch 240 is opened as an initial state (S1), and the gain is in a relatively large state. First, when the optical signal outputted from the ONU 2 is inputted to the light-receiving element 100 at the time T1, the optical current 10 is outputted as a burst signal 11. This optical current 10 is inputted to the pre-amplifier 200, and the Vout 20 is outputted to the average detection start determination unit 300. And, at time T2 (S2), in the average detection start determination unit 300, it is assumed to determine that the Vout 20 exceeds the threshold voltage 1. Then, the average detection signal 30 is transmitted to the average detection circuit 400 during a predetermined period of time T (T3-T2) from the average detection signal transmission circuit 320 included in the average detection start determination unit 300. The average detection circuit 400 which has received the average detection signal 30 detects an average value of the Vout 20 during the period of time T when the average detection signal 30 is received, and as a result, the Vave 40 is outputted during a certain period of time (S3). The Vave 40 is inputted to the gain switching control unit 500 at time T3, and is compared with the threshold voltage 2 by the comparator 510. In this example, since the signal with the large level is always inputted during the period of time T when the average value is detected, it is determined that the Vave 40 has exceeded the threshold voltage 2 (S4), and therefore, the output of the comparator 510 becomes at a High level, and is inputted to the gain switching signal transmission circuit 520. Then, the gain switching signal transmission circuit 520 sets the gain switching signal 60 to a High level to close the switch 240 of the pre-amplifier 200, so that the gain is reduced (S5). In this manner, as compared to the signal with the large input level, a low-distortion appropriate signal can be outputted. Also, the gain switching signal 60 is transmitted until time T4 (S6) when a signal of an external reset 50 for notifying the completion of the receiving of the burst signal 11 outputted from, for example, a MAC layer is inputted to the gain switching signal transmission circuit 520.

(Explanation on Average Detection Circuit 400)

Figure 5:
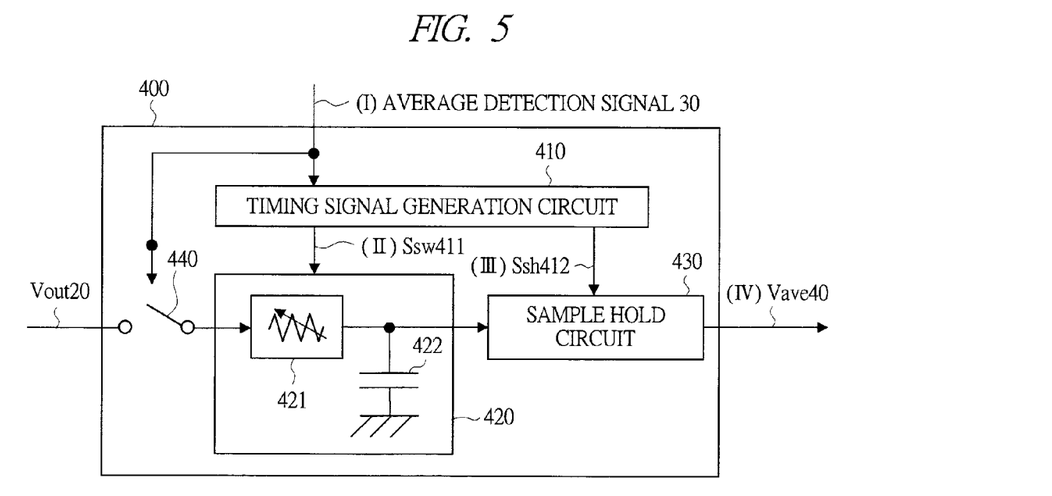
FIG. 5 is a diagram showing a configuration example of an average detection circuit in the transimpedance amplifier according to the first embodiment of the present invention.

The average detection circuit 400 is a circuit of detecting the average value obtained during the period of time T from the time point when the average detection signal 30 is received, and, as a result, outputting the value during the certain period of time. With reference to FIG. 5, a configuration example of the average detection circuit 400 will be described. The average detection circuit 400 includes: a timing signal generation circuit 410 for generating a resistance-value switching timing signal "Ssw" 411 and an average-value outputting timing signal "Ssh" 412 based on the average detection signal 30 transmitted from the average detection start determination unit 300; an integration circuit 420 for integrating the output Vout 20 of the pre-amplifier 200 as changing a time constant in accordance with the resistance-value switching timing signal Ssw 411; a sample hold circuit 430 for synchronizing an output signal of the integration circuit 420 with the average-value outputting timing signal Ssh 412 so as to be sampled as the average value Vave 40, and then, storing and outputting the value; and a switch 440 which is closed when the average detection signal 30 is at the High level to input the Vout 20 to the integration circuit 420.

(Explanation on Integration Circuit 420)

Figure 6:
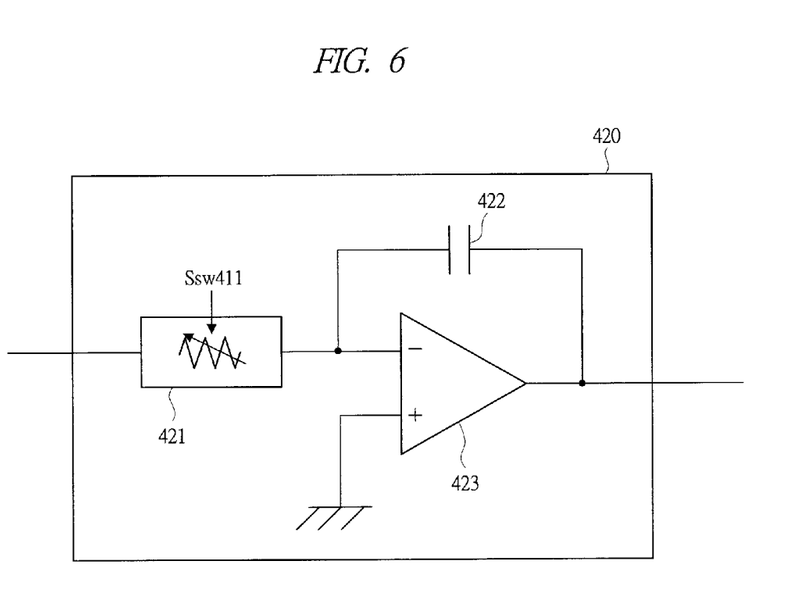
FIG. 6 is a diagram showing another configuration example of an integration circuit in the average detection circuit in the transimpedance amplifier according to the first embodiment of the present invention.

The integration circuit 420 is a circuit in which, for example, one end of a resistance circuit 421 is connected to the other end of a capacitor 422 whose one end is grounded, and its connection point is used as an output and an open side of the resistance circuit 421 is used as an input. The resistance circuit 421 is a circuit whose resistance value can be switched in two large and small steps in accordance with a level of a resistance-value switching timing signal "Ssw" 411, and may be a circuit in which the resistance value is small when the Ssw 411 is at a Low level and the resistance value is large when the Ssw 411 is at a High level. By using such a resistance circuit 421, the time constant of the integration circuit 420 is changed in two large and small steps. For this integration circuit 420, as shown in FIG. 6, an integration circuit including an operational amplifier 423 may be used.

(Explanation on Operation of Average Detection Circuit 400)

Figure 7:
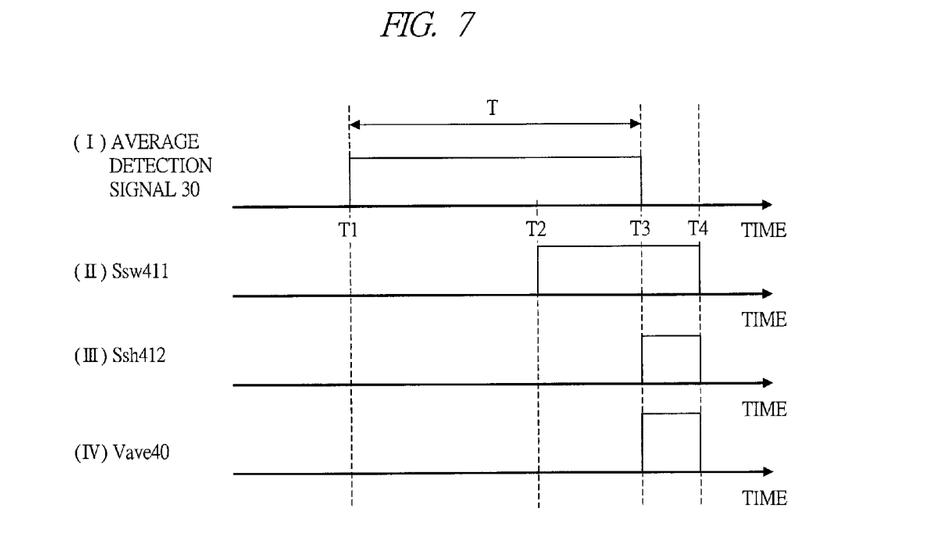
FIG. 7 is a diagram showing an operation timing example of the average detection circuit in the transimpedance amplifier according to the first embodiment of the present invention.

Here, an operation example of the average detection circuit 400 shown in FIG. 5 will be described as following an operation timing example shown in FIG. 7. Symbols (I) to (IV) shown in FIG. 7 correspond to the signals with the same symbols shown in FIG. 5, respectively.

In an initial state, the resistance-value switching timing signal Ssw 411 and the average-value outputting timing signal Ssh 412 are set to a Low level, and the time constant of the integration circuit 420 is fixed to a small value. When the average detection signal 30 is inputted to the average detection circuit 400 at time T1, first, the switch 440 is closed, and the output Vout 20 from the pre-amplifier 200 is inputted to the integration circuit 420. Also, the timing signal generation circuit 410 sets the Ssw 411 to a High level after passing a predetermined period of time (T2-T1) from a time point when the average detection signal 30 is detected, so that the time constant of the integration circuit 420 is increased. And, when the average detection signal 30 returns to a Low level at time T3, the Ssh 412 is outputted to the sample hold circuit 430 in a predetermined period of time (T4-T3), and at the same time, the sample hold circuit 430 which has received the Ssh 412 outputs the average value Vave 40. And, at the same time with the Ssh 412 being at the Low level, the Ssw 411 is set to the Low level, so that the state of the small time constant in the initial state is returned. In this manner, after the start of the detection of the average value, first, by setting the time constant of the integration circuit 420 to the small value, the average value can be rapidly reached, and then, by setting the time constant to the large value at the time point when the period of time T has passed after the Vout 20 exceeds the threshold voltage 1, a stable output can be obtained. However, if the stable average value can be obtained as described above, there is no problem even if other circuit configuration is used.

(Effect of First Embodiment)

According to the above-described first embodiment, the pre-amplifier 200, the average detection start determination unit 300, the average detection circuit 400, the gain switching control unit 500, and others are provided. In the first embodiment, the output voltage signal Vout 20 from the pre-amplifier 200 is compared with the threshold voltage 1, and, when this Vout 20 exceeds the threshold voltage 1, the average value Vave 40 of the Vout 20 generated during the certain period of time is detected, and the gain is reduced if this Vave 40 exceeds the threshold voltage 2, so that the burst signal with the large input level can be handled to obtain the appropriate output waveform. As a result, the transimpedance amplifier 5 can prevent the unnecessary gain switching caused when the noise due to the reflection of the downlink signal transmitted by the OLT 1, the leakage light from the other ONU 2, the reset signal in the OLT 1, or others is received, and also can prevent the decrease in sensitivity caused when the noise with the large input level is received, and then, the burst signal with the small input level is received.

[Second Embodiment]

For a transimpedance amplifier according to a second embodiment of the present invention, different parts from those of the first embodiment will be mainly described.

(Explanation on Operation of Second Embodiment)

Figure 8:
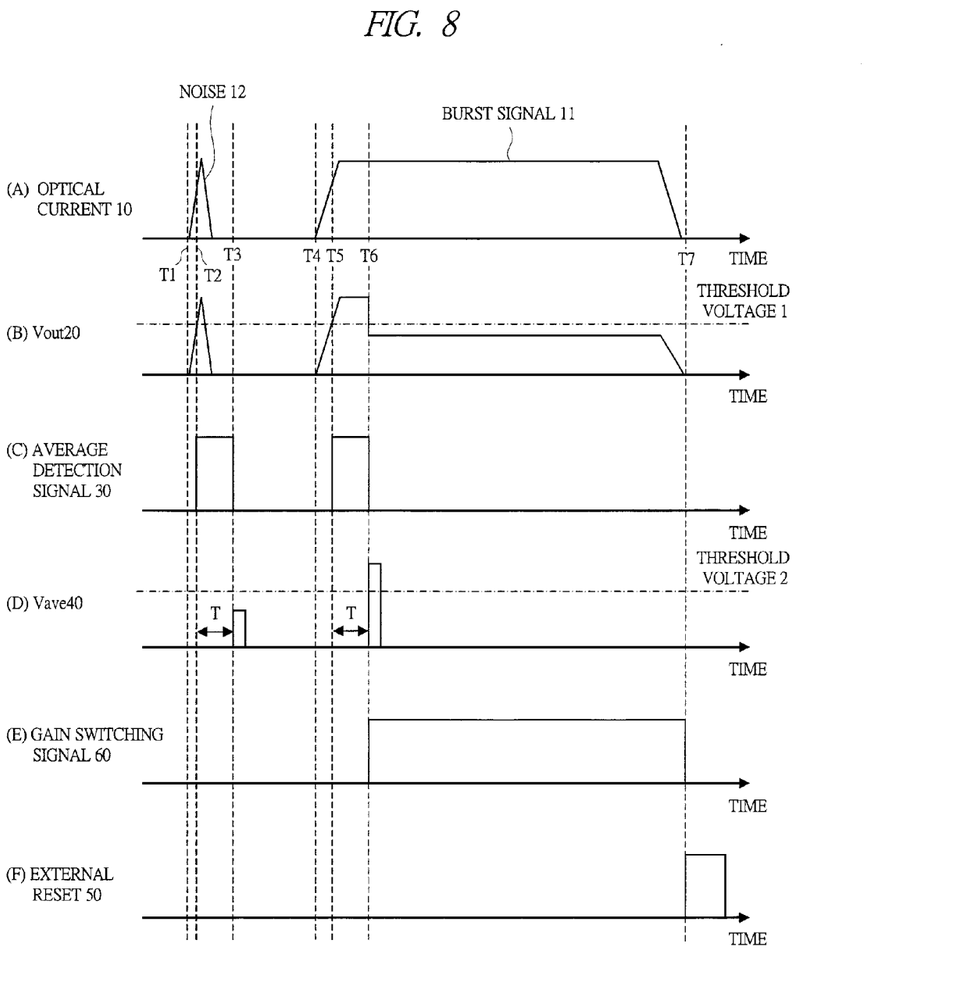
FIG. 8 is a diagram showing an operation timing example of a transimpedance amplifier according to a second embodiment of the present invention.

As the second embodiment of the present invention, an operation performed when the noise is received in an equivalent circuit to that of the first embodiment shown in FIG. 2 will be described as following an operation timing example of FIG. 8. Symbols (A) to (F) in FIG. 8 correspond to the signals with the same symbols in FIG. 2, respectively.

First, when the noise is inputted to the light-receiving element 100 at the time T1, the optical current 10 is generated as a noise 12. And, the output voltage signal Vout 20 of the pre-amplifier 200 is compared with the threshold voltage 1 by the comparator 310 in the average detection start determination unit 300, and it is assumed to determine that the Vout 20 has exceeded the threshold voltage 1 at the time T2. Then, similarly to the case of the first embodiment, the average value of the Vout 20 during the period of time T is detected, and the Vave 40 is outputted during the certain period of time and is compared with the threshold voltage 2 by the comparator 510 included in the gain switching control unit 500. At this time, the Vave 40 does not exceed the threshold voltage 2, and therefore, the gain switching of the pre-amplifier 200 is not executed, and the initial state of the gain is maintained.

In this manner, in the second embodiment, even when the noise 12 with the large input level is instantaneously inputted, the unnecessary switching can be avoided by using the average output value of the pre-amplifier 200 obtained during the certain period of time for determining the gain switching.

When the pre-amplifier 200 receives the noise 12, and then, receives the burst signal 11 at the time T4, the gain switching is executed depending on the input level similarly to the operation of the first embodiment.

[Third Embodiment]

For a transimpedance amplifier according to a third embodiment of the present invention, different parts from those of the first and second embodiments will be mainly described.

(Explanation on Circuit Configuration)

Figure 9:
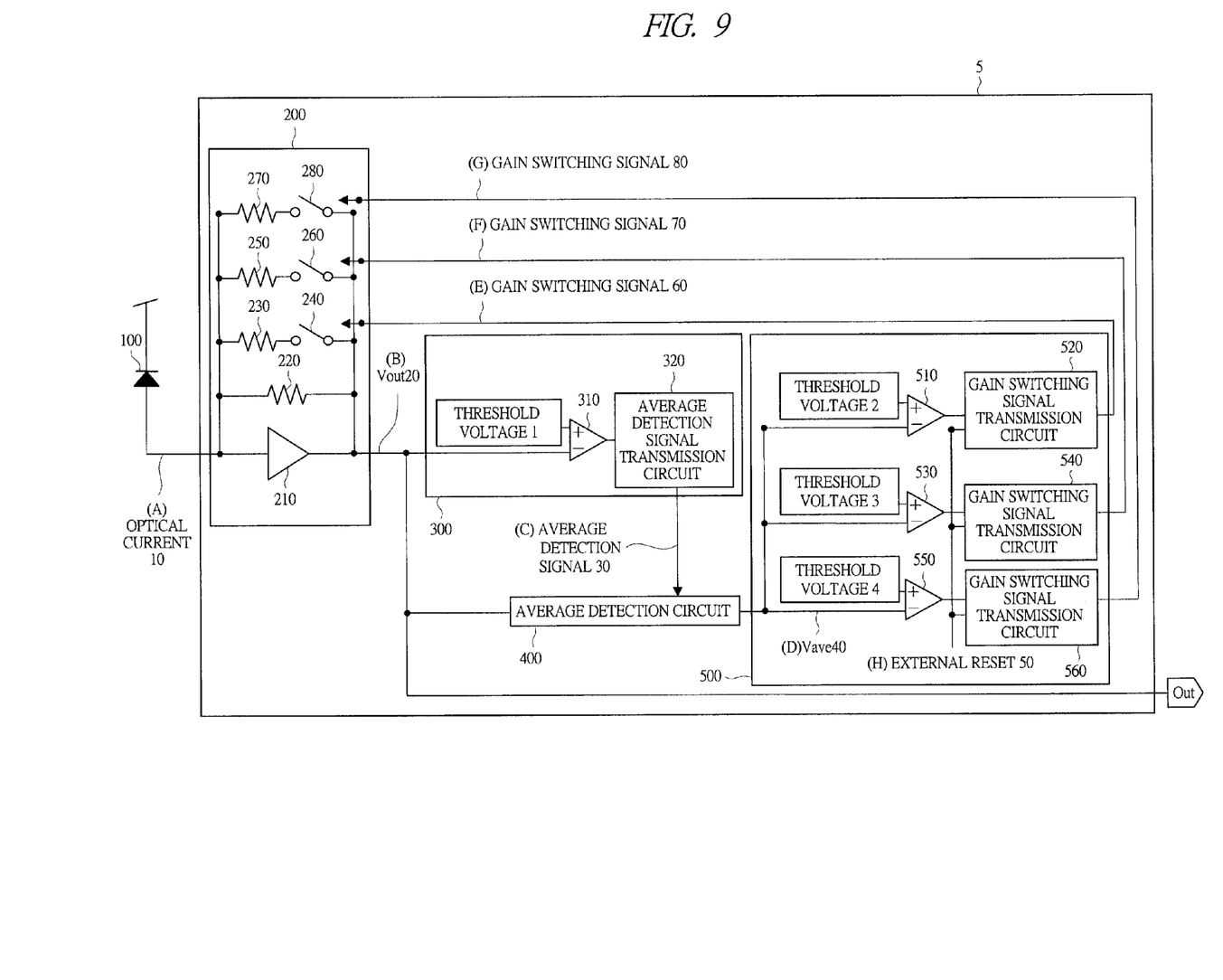
FIG. 9 is a diagram showing a configuration example of a transimpedance amplifier according to a third embodiment of the present invention.

The transimpedance amplifier according to the third embodiment of the present invention will be described below with reference to FIG. 9. The different parts in the circuit forms of the first and second embodiments are the configurations of the pre-amplifier 200 and the gain switching control unit 500.

First, in the pre-amplifier 200, while the two feedback resistors are connected in parallel in the first and second embodiments, four feedback resistors are connected in parallel in the present embodiment. More specifically, the pre-amplifier 200 includes: an inverting amplifier 210; feedback resistors 220, 230, 250, and 270 which are connected in parallel with the inverting amplifier; and switches 240, 260, and 280 which are connected in series with the feedback resistors 230, 250, and 270. Also, in the gain switching control unit 500, while it includes one comparator to compare the average value Vave 40 with the threshold voltage 2 in the first and second embodiments, it includes three comparators 510, 530, and 550 to compare the average value Vave 40 with three threshold voltages 2, 3, and 4 in the present embodiment. Here, a magnitude relation among the threshold voltages is expressed as "threshold voltage 2<threshold voltage 3<threshold voltage 4". In the gain switching signal transmission circuits 520, 540, and 560, when outputs of the respective comparators 510, 530, and 550 become at a High level, the gain switching signal transmission circuits transmit gain switching signals 60, 70, and 80 to the pre-amplifier 200 to close the switches 240, 260, and 280. In this manner, four gain values as combined with that in the initial state can be used.

(Explanation on Operation of Third Embodiment)

Figure 10:
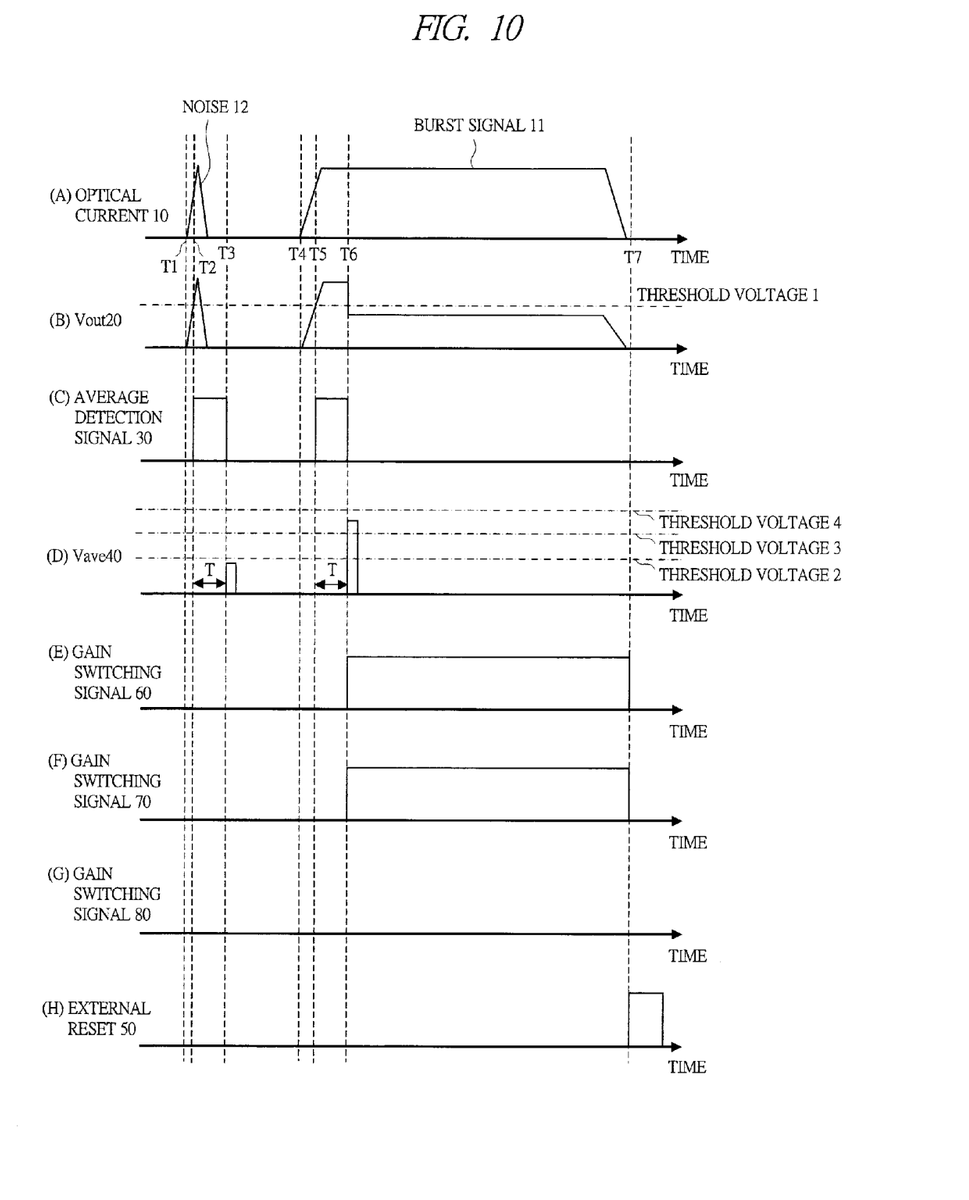
FIG. 10 is a diagram showing an operation timing example of the transimpedance amplifier according to the third embodiment of the present invention.

Here, with reference to FIGS. 9 and 10, the operation of the transimpedance amplifier according to the third embodiment will be described. Note that symbols (A) to (H) of FIG. 10 correspond to the signals with the same symbols of FIG. 9, respectively. First, the case that the noise 12 is inputted to the pre-amplifier 200 at the time T1 is similarly to that of the second embodiment, and the Vave 40 does not exceed any threshold voltage, and therefore, the unnecessary gain switching is not caused.

Next, the burst signal 11 is inputted to the pre-amplifier 200 at the time T4, and it is assumed to determine that the Vout 20 exceeds the threshold voltage 1 in the average detection start determination unit 300 at time T5. Then, similarly to the operations in the first and second embodiments, the average value of the Vout 20 obtained during the period of time T is detected in the average detection circuit 400, and is outputted to the gain switching control unit 500 as the Vave 40. Here, the Vave 40 is compared with threshold voltages 2, 3, and 4 in the comparators 510, 530, and 550 included in the gain switching control unit 500. In this example, the Vave 40 exceeds the threshold voltages 2 and 3, but does not exceed the threshold voltage 4 (threshold voltage 2<threshold voltage 3<Vave 40<threshold voltage 4), and therefore, the outputs of the comparators 510 and 530 become the High level. In accordance with that, the gain switching signal transmission circuits 520 and 540 set the gain switching signals 60 and 70 to the High level to close the switches 240 and 260 in the pre-amplifier 200. Here, since the Vave 40 does not exceed the threshold voltage 4, the gain switching signal 80 is not transmitted. By closing the switches 240 and 260, the feedback resistors 220, 230, and 250 are connected in parallel with each other in the pre-amplifier 200, so that the gain is reduced. When the gain switching signal transmission circuits 520 and 540 receive a signal of the external reset 50 at time T7, the signals return to the Low level again to open the switches 240 and 260.

In this manner, in the third embodiment, by providing three threshold voltages compared with the average value Vave 40, a settable gain value can be increased, and the dynamic range can be further widely ensured.

[Fourth Embodiment]

For a transimpedance amplifier according to a fourth embodiment of the present invention, different parts from those of the first to third embodiments will be mainly described.

(Explanation on Circuit Configuration)

Figure 11:
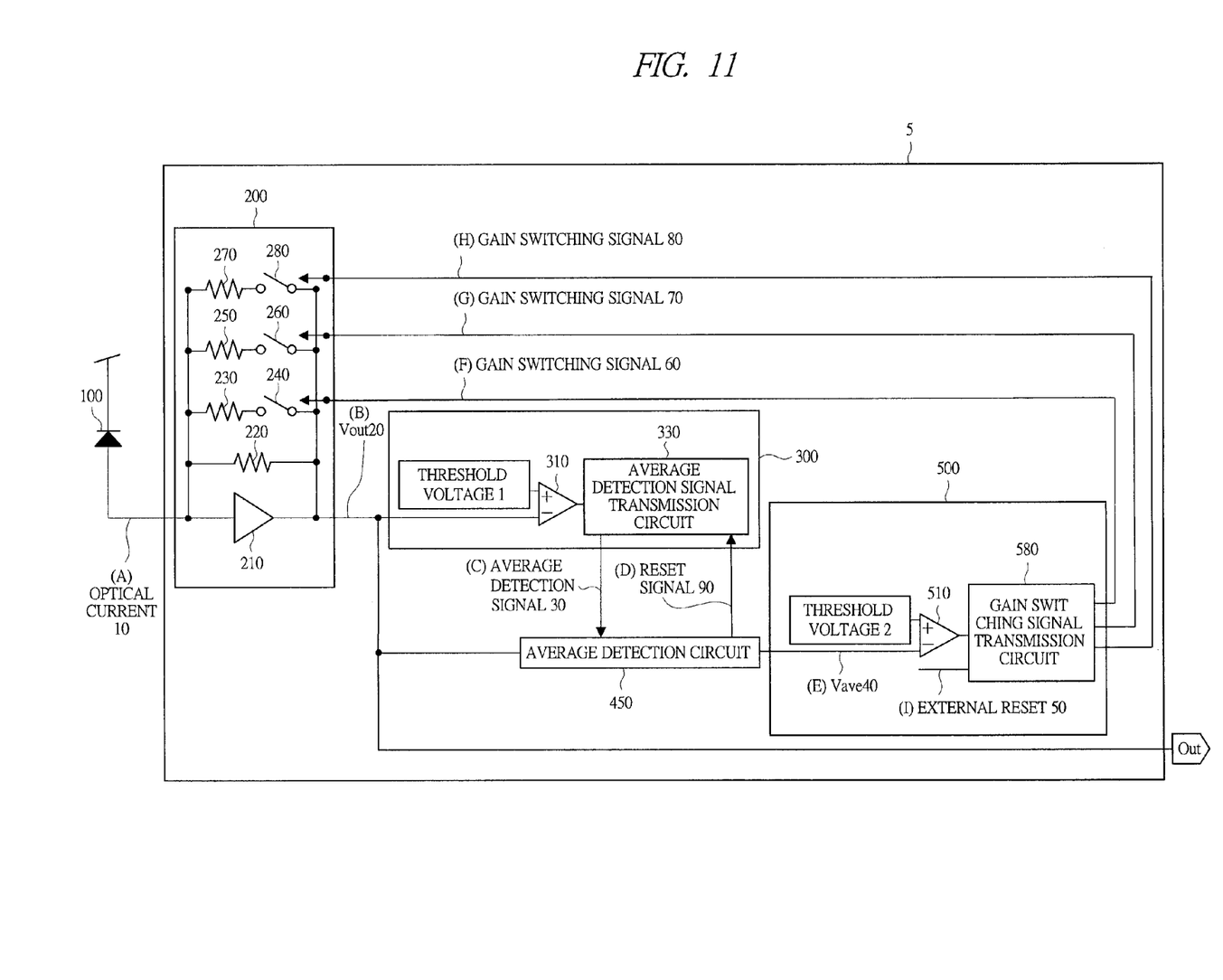
FIG. 11 is a diagram showing a configuration example of a transimpedance amplifier according to a fourth embodiment of the present invention.

A transimpedance amplifier according to a fourth embodiment of the present invention will be described below with reference to FIG. 11. In the present embodiment, while the four feedback resistors are provided in the pre-amplifier 200 similarly to the third embodiment, the configuration of the gain switching control unit 500 is different. The gain switching control unit 500 in the present embodiment includes: the comparator 510; and a gain switching signal transmission circuit 580. For the gain switching signal transmission circuit 580, a circuit for transmitting the gain switching signals as many as the number of times of detecting that the output of the comparator 510 is risen from the Low level to the High level is used. The gain switching signal generation circuit 580 can be achieved by using, for example, a counter circuit or others. Also, the average detection circuit 450 in the present embodiment transmits a reset signal 90 to an average detection signal transmission circuit 330 during outputting the average value Vave 40, and the average detection signal transmission circuit 330 does not transmit the average detection signal 30 during that. By providing such a configuration, the four gain values can be switched in a stepwise fashion in accordance with the input level.

(Explanation on Operation of Fourth Embodiment)

Figure 12:
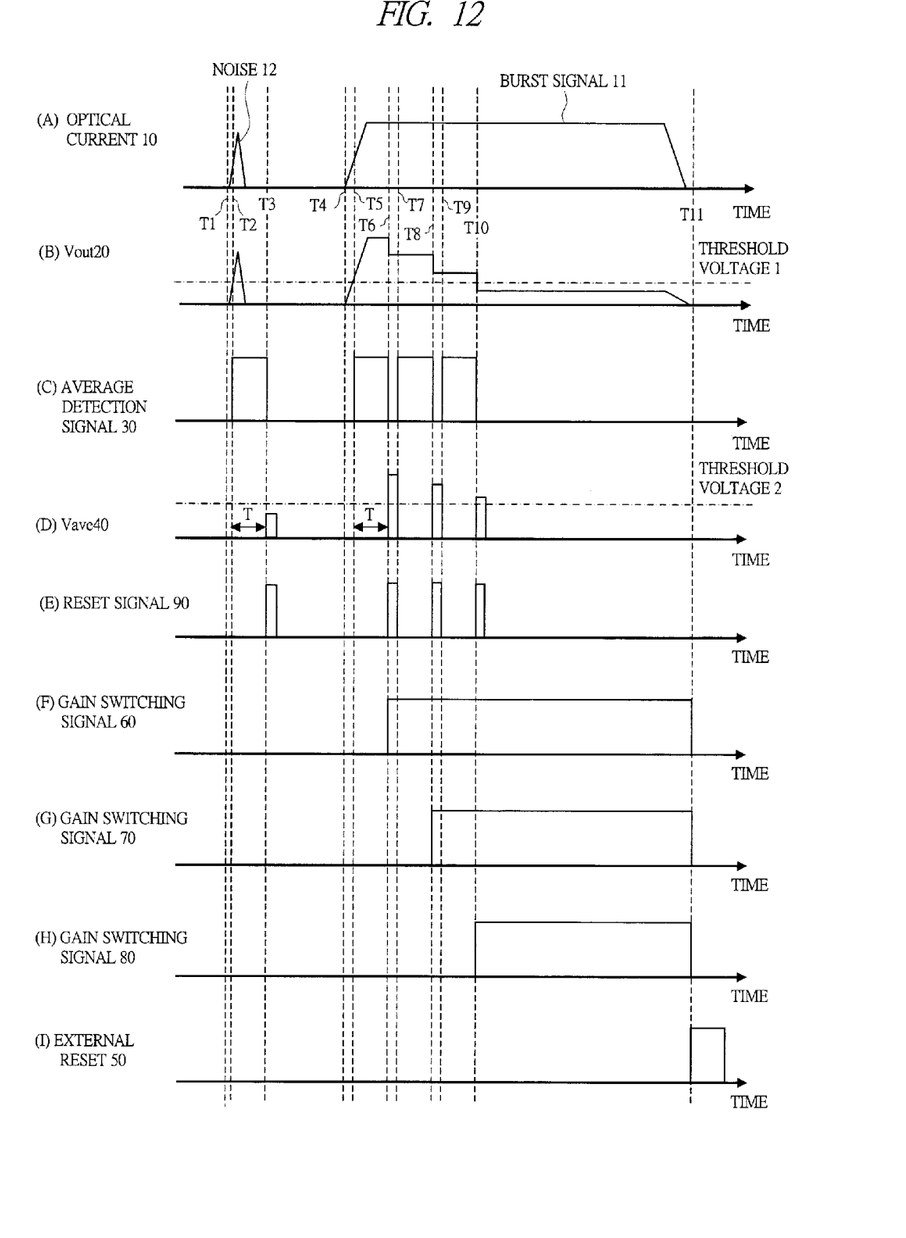
FIG. 12 is a diagram showing an operation timing example of the transimpedance amplifier according to the fourth embodiment of the present invention.

Here, with reference to FIGS. 11 and 12, an operation of the transimpedance amplifier according to the fourth embodiment will be described. Note that symbols (A) to (I) of FIG. 12 correspond to the signals with the same symbols of FIG. 11, respectively. First, the case that the noise 12 is inputted to the pre-amplifier 200 at the time T1 is similarly to that of the second embodiment, and the Vave 40 does not exceed any threshold voltage, and therefore, the unnecessary gain switching is not caused.

Next, the burst signal 11 is inputted to the pre-amplifier 200 at the time T4, and it is assumed to determine that the Vout 20 exceeds the threshold voltage 1 at the time T5 in the average detection start determination unit 300. Then, similarly to the operations in the first to third embodiments, the average value of the Vout 20 obtained during the period of time T is detected in the average detection circuit 450, and is outputted to the gain switching control unit 500 as the Vave 40. Here, the Vave 40 is compared with the threshold voltage 2 in the comparator 510 included in the gain switching control unit 500, and it is determined that the Vave 40 has exceeded the threshold voltage 2, and therefore, the output of the comparator 510 becomes the High level. Then, the gain switching signal transmission circuit 580 sets the gain switching signal 60 to the High level by detecting a first rising of the output of the comparator 510, and closes the switch 240 in the pre-amplifier 200. Also, the average detection circuit 450 controls to transmit the reset signal 90 to the average detection signal transmission circuit 330 during a period of time T7 when the average value Vave 40 is outputted to the gain switching control unit 500, and not to transmit the average detection signal 30 in the average detection signal transmission circuit 330 during that.

When the first gain switching operation is finished and the Vave 40 and the reset signal 90 outputted by the average detection circuit 450 return to the Low level, the Vout 20 and the threshold voltage 1 are compared with each other again in the average detection start determination unit 300 at the time T7. As a result, if the Vout 20 exceeds the threshold voltage 1, the average detection signal 30 is transmitted to the average detection circuit 450 to detect the average value. At this time, if the Vave 40 exceeds the threshold voltage 2, the gain switching signal transmission circuit 580 detects a second rising of the output of the comparator 510, and sets the gain switching signal 70 to the High level, so that the switch 260 is closed, and therefore, the gain is further reduced.

Similarly, when the second gain switching operation is finished, the Vout 20 and the threshold voltage 1 are compared with each other again at time T9. Based on the result, the detection of the average value is started, and then, if the Vout 40 exceeds the threshold voltage 2, the gain switching signal transmission circuit 580 detects a third signal rising of the comparator 510, and the gain switching signal 80 is transmitted, so that the switch 280 is closed, and therefore, the smallest gain is obtained. When the receiving of the burst signal 11 is finished and the gain switching signal transmission circuit 580 receives the signal of the external reset 50 at time T11, all gain switching signals return to the Low level, so that the switches 240, 260, and 280 are opened.

By such an operation, in the fourth embodiment, the gain can be reduced stepwise in accordance with the input level to the transimpedance amplifier.

[Others]

Note that each of the above-described embodiments is preferable embodiment of the present invention. However, the present invention is not limited to the above-described embodiments, and various modifications and alterations can be made within the scope of the present invention. For example, while the four feedback resistors are connected in the third and fourth embodiments, the number of feedback resistors may be three or five or more.

Industrial Applicability

The present invention relates to a PON system including an OLT and a plurality of ONUs, and more particularly, the present invention can be used for a technique of switching a gain in a transimpedance amplifier in a burst signal receiver.

Explanation On Symbols

1 OLT
2 ONU
3 optical fiber
4 optical divider
5 transimpedance amplifier
10 optical current
11 burst signal
12 noise
20 voltage signal Vout
30 average detection signal
40 average value Vave 50 external reset
60, 70, and 80 gain switching signal
90 reset signal
100 light-receiving element
200 pre-amplifier
210 inverting amplifier
220, 230, 250, and 270 feedback resistor
240, 260, and 280 switch
300 average detection start determination unit
310 comparator
320 and 330 average detection signal transmission circuit
400 average detection circuit
410 timing signal generation circuit
411 resistance-value switching timing signal Ssw
412 average-value outputting timing signal Ssh
420 integration circuit
421 resistance circuit
422 capacitor
423 operational amplifier
430 sample hold circuit
440 switch
450 average detection circuit
500 gain switching control unit
510, 530, and 550 comparator
520, 540, 560, and 580 gain switching signal transmission circuit
600 post-amplifier
700 PHY
800 MAC frame processing unit

The invention claimed is:

1. A gain-switching-type transimpedance amplifier in a burst signal receiver included in an OLT of a PON system, comprising:
   a pre-amplifier to which a burst signal is inputted;
   an average detection start determination unit for comparing an output of the pre-amplifier with a first threshold voltage;
   an average detection circuit for detecting and outputting an average value of the output of the pre-amplifier during a certain period of time from a time point when the output of the pre-amplifier exceeds the first threshold voltage; and
   a gain switching control unit for determining whether to switch a gain of the pre-amplifier based on an output of the average detection circuit.

2. The transimpedance amplifier according to claim 1, wherein
   the pre-amplifier includes: an inverting amplifier; a feedback resistor connected in parallel with the inverting amplifier; and a feedback circuit connected in parallel with the feedback resistor,
   the feedback circuit includes: a resistor; and a switch, and
   the gain is controlled by opening and closing the switch.

3. The transimpedance amplifier according to claim 1, wherein
   the average detection start determination unit transmits an average detection signal during a predetermined period of time if the output of the pre-amplifier exceeds the first threshold voltage.

4. The transimpedance amplifier according to claim 1, wherein
   the average detection circuit detects an average value of the output of the pre-amplifier during an arbitrary period of time when an average detection signal outputted by the average detection start determination unit is received, and outputs the average value during a certain period of time.

5. The transimpedance amplifier according to claim 1, wherein
   the gain switching control unit compares the output of the average detection circuit with a second threshold voltage, transmits a gain switching signal to the feedback circuit of the pre-amplifier to close the switch of the feedback circuit to control the gain, and continuously transmits the gain switching signal until an external reset signal is received.

6. The transimpedance amplifier according to claim 1, wherein
   the pre-amplifier includes: an inverting amplifier; a feedback resistor connected in parallel with the inverting amplifier; and m (m is one or more) pieces of feedback circuits each connected in parallel with the feedback resistor,
   each of the feedback circuits includes: a resistor; and a switch, and
   the gain is controlled by opening and closing the switch.

7. The transimpedance amplifier according to claim 1, wherein
   the gain switching control unit compares the output of the average detection circuit with second to (m+1)th threshold voltages whose values are different from each other and which are corresponded one-to-one to the feedback circuit of the pre-amplifier, transmits a gain switching signal corresponded to each of the second to (m+1)th threshold voltages to the feedback circuit to close the switch of the feedback circuit is closed to control the gain, and continuously transmits the gain switching signal until an external reset signal is received.

8. The transimpedance amplifier according to claim 1, wherein
   the average detection start determination unit transmits an average detection signal during a predetermined period of time if the output of the pre-amplifier exceeds the first threshold voltage, and does not transmit the average detection signal during receiving a reset signal from the average detection circuit even if the output of the pre-amplifier exceeds the first threshold voltage.

9. The transimpedance amplifier according to claim 1, wherein
   the average detection circuit detects an average value of the output of the pre-amplifier during a predetermined period of time when the average detection signal outputted by the average detection start determination unit is received, and outputs the average value to the gain switching control unit during a certain period of time, and at the same time, outputs a reset signal to the average detection start determination unit during a certain period of time to suppress the transmission of the average detection signal.

10. The transimpedance amplifier according to claim 1, wherein,
    when the gain switching control unit receives an external reset signal, and then, detects that an output of the average detection circuit exceeds a second threshold voltage n-times (n≤m), the gain switching control unit transmits an n-th gain switching signal among the gain switching signals corresponded one-to-one to the feedback circuit of the pre-amplifier to close the switch of the feedback circuit to control the gain, and continuously transmits the gain switching signal until the external reset signal is received.

11. A PON system which includes an OLT and a plurality of ONUs and in which the OLT and the plurality of ONUs are connected with each other via an optical fiber, the OLT comprising:
a pre-amplifier to which a burst signal is inputted;
an average detection start determination unit for comparing an output of the pre-amplifier with a first threshold voltage;
an average detection circuit for detecting and outputting an average value of the output of the pre-amplifier during a certain period of time from a time point when the output of the pre-amplifier exceeds the first threshold voltage; and
a gain switching control unit for determining whether to switch a gain of the pre-amplifier based on an output of the average detection circuit.

12. The PON system according to claim 11, wherein
the pre-amplifier included in the OLT includes: an inverting amplifier; a feedback resistor connected in parallel with the inverting amplifier; and a feedback circuit connected in parallel with the feedback resistor,
the feedback circuit includes: a resistor; and a switch, and
the gain is controlled by opening and closing the switch.

13. The PON system according to claim 11, wherein
the average detection start determination unit included in the OLT transmits an average detection signal during a predetermined period of time if the output of the pre-amplifier exceeds the first threshold voltage.

14. The PON system according to claim 11, wherein
the average detection circuit included in the OLT detects an average value of the output of the pre-amplifier during an arbitrary period of time when an average detection signal outputted by the average detection start determination unit is received, and outputs the average value during a certain period of time.

15. The PON system according to claim 11, wherein
the gain switching control unit included in the OLT compares the output of the average detection circuit with a second threshold voltage, and transmits a gain switching signal to the feedback circuit of the pre-amplifier to close the switch of the feedback circuit to control the gain, and continuously transmits the gain switching signal until an external reset signal is received.

16. The PON system according to claim 11, wherein
the pre-amplifier included in the OLT includes: an inverting amplifier; a feedback resistor connected in parallel with the inverting amplifier; and m (m is one or more) pieces of a feedback circuit connected in parallel with the feedback resistor,
the feedback circuit includes: a resistor; and a switch, and
the gain is controlled by opening and closing the switch.

17. The PON system according to claim 11, wherein
the gain switching control unit included in the OLT compares the output of the average detection circuit with second to (m+1)th threshold voltages whose values are different from each other and which are corresponded one-to-one to the feedback control of the pre-amplifier, transmits a gain switching signal corresponded to each of the second to (m+1)th threshold voltages to the feedback circuit to close the switch of the feedback circuit to control the gain, and continuously transmits the gain switching signal until an external reset signal is received.

18. The PON system according to claim 11, wherein
the average detection start determination unit included in the OLT transmits an average detection signal during a predetermined period of time if the output of the pre-amplifier exceeds the first threshold voltage, and does not transmit the average detection signal during receiving a reset signal from the average detection circuit even if the output of the pre-amplifier exceeds the first threshold voltage.

19. The PON system according to claim 11, wherein
the average detection circuit included in the OLT detects an average value of the output of the pre-amplifier during a predetermined period of time when the average detection signal outputted by the average detection start determination unit is received, and outputs the average value to the gain switching control unit during a certain period of time, and at the same time, outputs a reset signal to the average detection start determination unit during a certain period of time to suppress the transmission of the average detection signal.

20. The PON system according to claim 11, wherein,
when the gain switching control unit included in the OLT receives an external reset signal, and then, detects that an output of the average detection circuit exceeds a second threshold voltage n-times ($n \leq m$), the gain switching control unit transmits a n-th gain switching signal among the gain switching signals corresponded one-to-one to the feedback circuit of the pre-amplifier to close the switch of the feedback circuit to control the gain, and continuously transmits the gain switching signal until the external reset signal is received.

* * * * *